United States Patent [19]

Chu et al.

[11] Patent Number: 5,801,440
[45] Date of Patent: Sep. 1, 1998

[54] CHIP PACKAGE BOARD HAVING UTILITY RINGS

[75] Inventors: Edwin Chu, Cupertino; Hu-Kong Lai, San Jose, both of Calif.

[73] Assignee: ACC Microelectronics Corporation, Santa Clara, Calif.

[21] Appl. No.: 541,423

[22] Filed: Oct. 10, 1995

[51] Int. Cl.$^6$ .................... H01L 23/52; H01L 23/48
[52] U.S. Cl. .................... 257/691; 257/692; 257/782
[58] Field of Search .................... 257/692, 691, 257/666, 698, 782, 697, 700, 659, 660, 664, 275

[56] References Cited

U.S. PATENT DOCUMENTS

| | | | |
|---|---|---|---|
| 4,608,592 | 8/1986 | Miyamoto | 257/691 |
| 4,631,572 | 12/1986 | Zimmerman | 257/691 |
| 5,105,257 | 4/1992 | Michii | 257/692 |
| 5,221,417 | 6/1993 | Basavanhally | 156/629 |
| 5,241,133 | 8/1993 | Mullen, III et al. | 174/52.4 |
| 5,245,214 | 9/1993 | Simpson | 257/666 |
| 5,376,588 | 12/1994 | Pendse | 437/211 |
| 5,386,141 | 1/1995 | Liang et al. | 257/691 |
| 5,490,324 | 2/1996 | Newman | 257/700 |
| 5,525,834 | 6/1996 | Fischer et al. | 257/691 |
| 5,530,287 | 6/1996 | Currie et al. | 257/692 |

FOREIGN PATENT DOCUMENTS 4-129250  4/1992  Japan .................... 257/666

*Primary Examiner*—Mahshid D. Saadat
*Assistant Examiner*—Jhihan B. Clark
*Attorney, Agent, or Firm*—Thomas Schneck; George B. F. Yee

[57] ABSTRACT

A chip package includes a circuit board having a first surface with an inner die-attach region, an outer signal trace region and an intermediate utility region. Within the utility region are a number of traces for providing fixed electrical potentials to an integrated circuit die mounted within the die-attach region. In the preferred embodiment, the utility region includes a ring-like ground trace, a $V_{DD}$ trace and a segmented outer trace, with the segments of the segmented trace being connected to at least two fixed voltages for operating the integrated circuit die. Bond wires or leads of a leadframe include inner wire/lead ends connected to input/output pads of the die and include outer wire/lead ends connected to either a trace or trace segment in the utility region or a signal trace located in the outer signal trace region. The resulting chip package may be of the ball grid array type.

22 Claims, 4 Drawing Sheets

CHIP PACKAGE BOARD HAVING UTILITY RINGS

TECHNICAL FIELD

The invention relates generally to chip packages for integrated circuit dies and more particularly to providing ground and power connections to chip packages.

BACKGROUND ART

There is a wide variety of chip packages for mounting and encapsulating an integrated circuit die. One type is referred to as a ball grid array (BGA) package. A BGA package includes a circuit board having an array of solder bumps to be used to provide mechanical and electrical connection to a motherboard or the like.

The integrated circuit die is typically connected to the surface of the BGA circuit board opposite to the surface having the array of raised solder bumps. U.S. Pat. No. 5,241,133 to Mullen, III et al. describes a chip package in which one side of the integrated circuit die is adhered to the top surface of the circuit board of the package, so that the input/output pads of the die are exposed at the top side of the die. Wire bonds or other known forms of interconnecting leads are used to electrically connect the input/output pads of the die to traces or pads on the circuit board. If the die is on the side of the circuit board opposite to the solder bumps, conductive vias are formed through the circuit to conduct signals from the solder bumps to the pads or traces. A molding compound may then be used to encapsulate the integrated circuit die and the wire bonds or leads and to cover most or all of the surface of the circuit board opposite to the solder bumps.

A circuit board of a package for carrying an integrated circuit die having a high density of input/output pads will typically include signal traces that fan out with distance from the die. The bond wires have inner lead ends connected to the input/output pads of the die and have outer lead ends that connect to the inner trace ends of the signal traces. By fanning out with departure from the die, the array of signal traces may be considered to be a "space transformer." The ends of the signal traces furthest from the die may be spaced apart by greater distances, allowing the use of vias and solder bumps. The space transformation accommodates the high density input/output pads of the integrated circuit die. Nevertheless, there is still a limit to the number of traces. Moreover, ground and the various power connections occupy some of the limited number of signal traces. Further increases in the density of input/output pads on an integrated circuit die may be accommodated by implementing dimensional changes that include the potential of adversely affecting performance of the resulting chip package. For example, the inner signal trace ends may be moved further from the die, so that the area for arranging the inner signal trace ends is greater at each of the four sides of the die. However, while the greater length for arrangement of trace ends allows a greater number of traces, the concern is that the necessary increase in the length of bond wires to connect the pads of the die to the more distant inner signal ends will lead to a reduction in the signal-to-noise ratios of signals conducted to and from the die.

An object of the invention is to provide a chip package in which an increase of signal conduction can be accommodated without a sacrifice of signal integrity.

SUMMARY OF THE INVENTION

The above object has been met by a chip package having a circuit board having a central die-attach region surrounded by a utility region. Signal traces are on a side of the utility region opposite to the die-attach region.

Within the utility region are traces that are utilized to provide ground and power to an integrated circuit die fixed within the die-attach region. In the preferred embodiment, the ground and power traces have a ring-like configuration. A radially inward four-sided trace is connected to electrical ground, i.e. $V_{SS}$. A second four-sided trace is connected to $V_{DD}$, e.g., +5 volts. Moreover, in the preferred embodiment, there is a third ring-like trace that is segmented. Adjacent segments may be connected to different sources of fixed voltages. The selection of the fixed voltages depends upon the required voltages for operating the integrated circuit die fixed within the die-attach region.

Beyond the utility region are inner trace ends of signal traces for conducting signals to and from the integrated circuit die. The inner trace ends define an array of bond sites. Wire bonds may be used to connect the inner trace ends to input/output pads on the integrated circuit die. From the inner trace ends, signal traces fan outwardly away from the die to an array of vias. In the preferred embodiment, the circuit board is a board of a ball grid array package. The vias pass through the circuit board to solder balls that are used to electrically and mechanically connect the package to a substrate, such as a motherboard. Optionally, a limited number of traces extend inwardly to vias that are positioned between the utility region and the inner trace ends. This limited number of vias is used to pass signals to traces on the opposite side of the circuit board for connection to solder balls.

For each of the ground and power traces and the segments of the power traces, vias pass the fixed electrical potentials from the side of the circuit board having the solder balls to the side of the circuit board having the integrated circuit die. In attaching wire bonds, inner lead ends of the leadframe are bonded to the input/output pads of the integrated circuit die. A first plurality of outer lead ends of the wire bonds is connected to the ground trace in the utility region. The connections to the ground trace and the power traces and segments are dictated by the requirements of the die. A second plurality of outer lead ends of the wire bonds is connected to the $V_{DD}$ trace. Other voltage requirements to the die are supplied by means of connection of outer lead ends to segments of the segmented trace. Most of the outer lead ends of the wire bonds are connected to the inner trace ends of the signal traces for the conduction of signals. Of course, interconnecting leads such as those of a tape automated bonding frame may be used in place of the wire bonds.

An advantage of the invention is that the traces that are located in the signal trace region may be used more efficiently for conducting electrical signals. Optionally, none of the signal traces is used for connecting the integrated circuit die to a supply of a fixed voltage. Rather, the fixed voltages are provided by connection to the power and ground traces in the utility region. Moreover, by providing a ground ring surrounding the die, there is a potential that noise will be reduced. Another advantage of the invention is that because a percentage of the wire bonds do not extend to the array of board bond sites defined by the inner trace ends, there is not a one-to-one correspondence between the number of input/output pads on the die and the number of board bond sites in the array. With fewer board bond sites for a given number of input/output pads on the die, the array of board bond sites may be somewhat closer to the die, thereby reducing the required length of the wire bond.

BEST MODE FOR CARRYING OUT THE INVENTION

Figure 1:
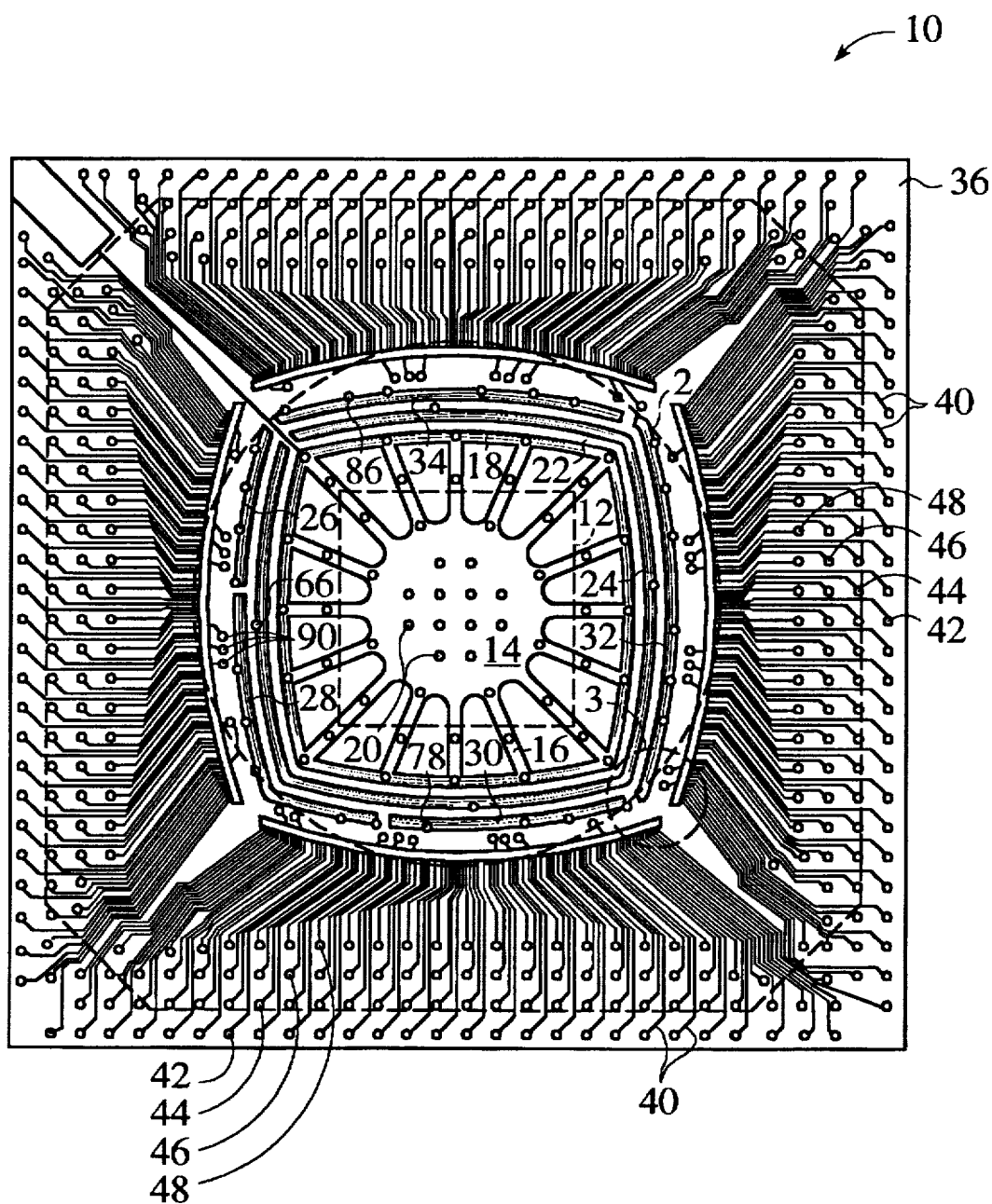
FIG. 1 is a top view of a circuit board of an integrated circuit package having a utility region in accordance with the invention.
Figure 2:
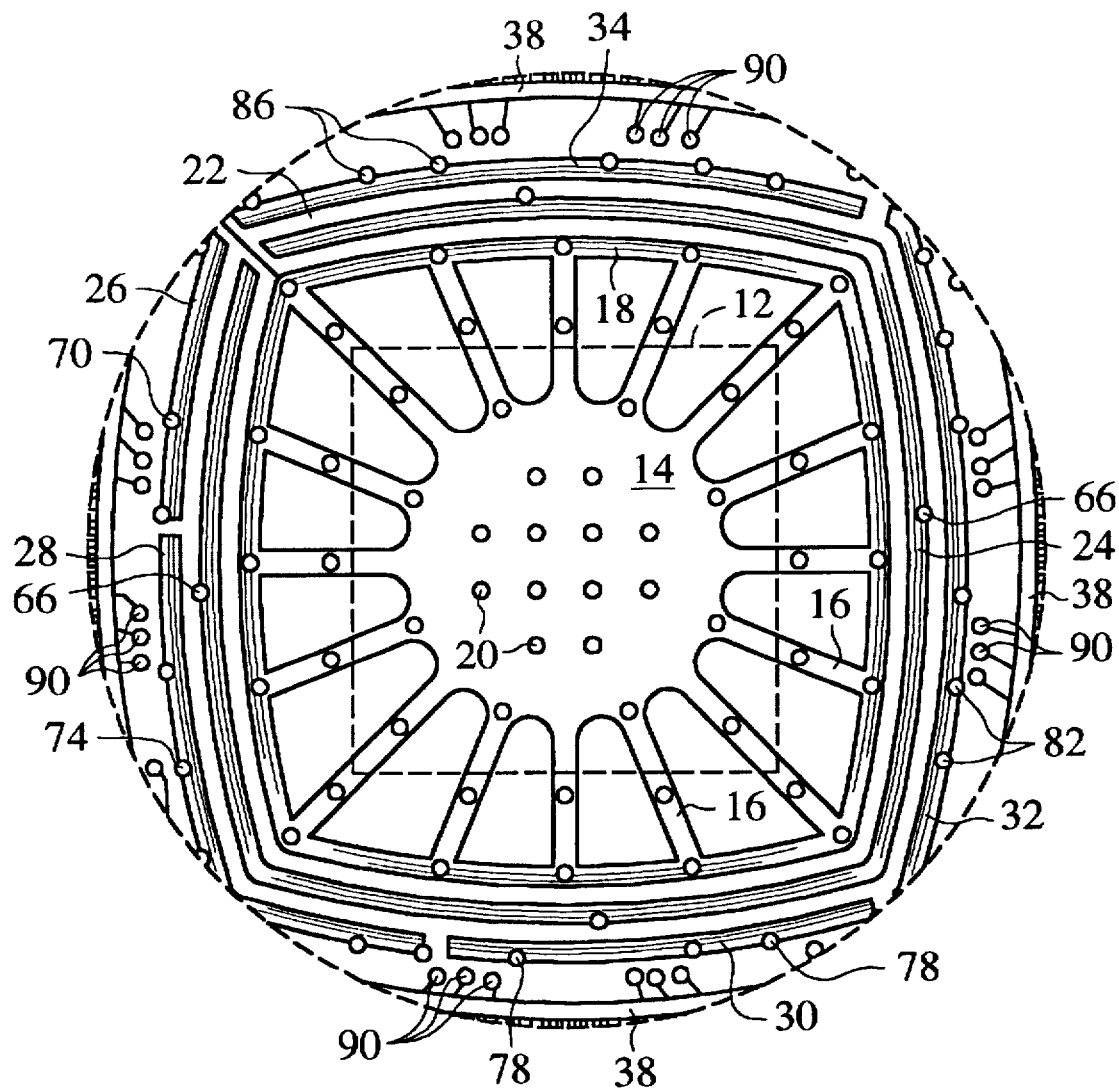
FIG. 2 is a top view of a central area of FIG. 1, within circle 2.

With reference to FIGS. 1 and 2, a circuit board 10 is shown as having a central die-attach region 12 shown by dashed lines. As will be described more fully below, an integrated circuit die is connected to the die-attach region using conventional techniques. In the embodiment of FIGS. 1 and 2, the region includes a patterned metallization. At the center of the region is a solid metal area 14. Metallic legs 16 extend radially to a four-sided ground trace 18. Plated through vias 20 contact the surface of the integrated circuit die and are used to conduct thermal energy from the die to the opposite side of the circuit board 10. The thermal energy is then conducted to a substrate to which the circuit board is attached.

Beyond the die-attach region 12 is a utility region 22. The utility region includes the ground trace 18, a $V_{DD}$ trace 24, and a segmented trace that includes five segments 26, 28, 30, 32 and 34. The number of segments in the segmented trace is not critical to the invention.

Figure 3:
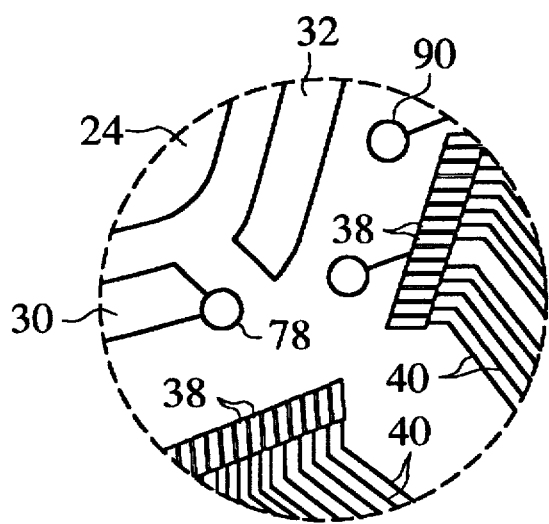
FIG. 3 is a top view of a limited number of inner trace ends of the signal traces of FIG. 1, within circle 3.

The utility region 22 is surrounded by a signal trace region 36. The signal trace region includes an array of signal traces, as is well known in the art. Referring briefly to FIG. 3, the inner trace ends 38 provide bond sites for connection to wire bonds, not shown. The wire bonds conduct signals and fixed electrical potential to the integrated circuit die. The individual wire bonds include inner ends that are bonded to input/output pads of the die and include outer ends that are bonded to the inner trace ends 38 of FIG. 3. Signals are conducted along the surface of the circuit board 10 by means of traces 40. Most of the traces 40 extend in a direction away from the die-attach region 12 to four rows of vias 42, 44, 46 and 48. The vias are conductive through-holes that are formed using conventional techniques.

Referring now to FIGS. 1, 2 and 3, each of the vias 42–48 in the four rows of vias is connected to a solder ball 50, 52, 54 and 56. As will be explained more fully below, the bottom side of the circuit board 10 includes more solder balls than the outermost four rows of solder balls. In operation, the solder balls on the bottom surface of the circuit board 10 are aligned with a corresponding array of contact pads on another substrate, such as a motherboard. By properly heating the solder, the circuit board is surface mounted to the motherboard to provide the necessary power and signal communication to the integrated circuit die attached at the top surface of the circuit board.

In addition to the four rows of solder balls 50–56 associated with the vias 42–48, there is a fifth row of solder balls on the bottom surface of the circuit board 10. This innermost row of solder balls has a lower ratio of signal contacts-to-ground and power contacts. As previously noted, there are central vias 20 and solder balls that are used to conduct thermal energy from the integrated circuit die to the motherboard to which the circuit board 10 is surface mounted. The bottom side of the circuit board includes a solid metal area 58 and radially extending legs 60 generally matching the pattern of metallization on the top surface of FIG. 1. The radially extending legs 60 reach a ground ring 62 on the bottom surface. A pattern of vias extends through the bottom legs 60 to the legs 16 on the upper surface and through the bottom ground ring 62 to the ground trace 18 on the upper surface in order to ensure uniformity in the ground potential provided by the circuit board 10.

Extending outwardly from the ground ring 62 on the bottom surface of the circuit board 10 are traces to grounded solder balls 64 in the fifth row of the five-row ball grid array. Regarding the $V_{DD}$ trace 24 on the top side of the circuit board 10, there are a number of vias 66 that contact the $V_{DD}$ trace, penetrate the circuit board, and connect to $V_{DD}$ solder balls 68 on the bottom surface of the circuit board. Thus, the $V_{DD}$ voltage, e.g., five volts, is supplied to the top-side $V_{DD}$ trace 24 by connection to the $V_{DD}$ solder ball 68.

The trace segments 26–34 are also connected to sources of a fixed potential. The trace segment 26 electrically contacts four vias 70 that extend to separate $V_{CC1}$ balls 72. Top-side trace segment 28 contacts a number of vias 74 that receive a fixed $V_{CC2}$ voltage from the motherboard by means of solder balls 76 in the innermost row in the ball grid array.

The top-side trace segment 30 contacts vias 78 that receive a $V_{CC3}$ voltage at solder balls 80. In a similar fashion, trace segment 32 receives a $V_{CC4}$ voltage by connection of vias 82 to solder balls 84. In addition to the supply of the $V_{CC1}$ voltage at trace segment 26, trace segment 34 is connected to the $V_{CC1}$ supply by vias 86 and solder balls 88.

The segmented ring-like trace that includes segments 26–34 allows various fixed voltages to be supplied to the integrated circuit chip without occupying signal traces 40 to the four rows of vias 42–48. This increases the ratio of signal contacts-to-voltage contacts at the inner trace ends 38 of the traces 40 of FIGS. 1–3. Referring to FIG. 1, the ratio is further increased by providing a number of signal vias 90 that are located between the inner trace ends and the segments 26–34. The signal vias 90 are connected to selected inner trace ends by short traces on the top surface of the circuit board 10. Thus, in contrast to conventional chip carrier boards, some of the signals progress similarly from the bond pads.

Figure 4:
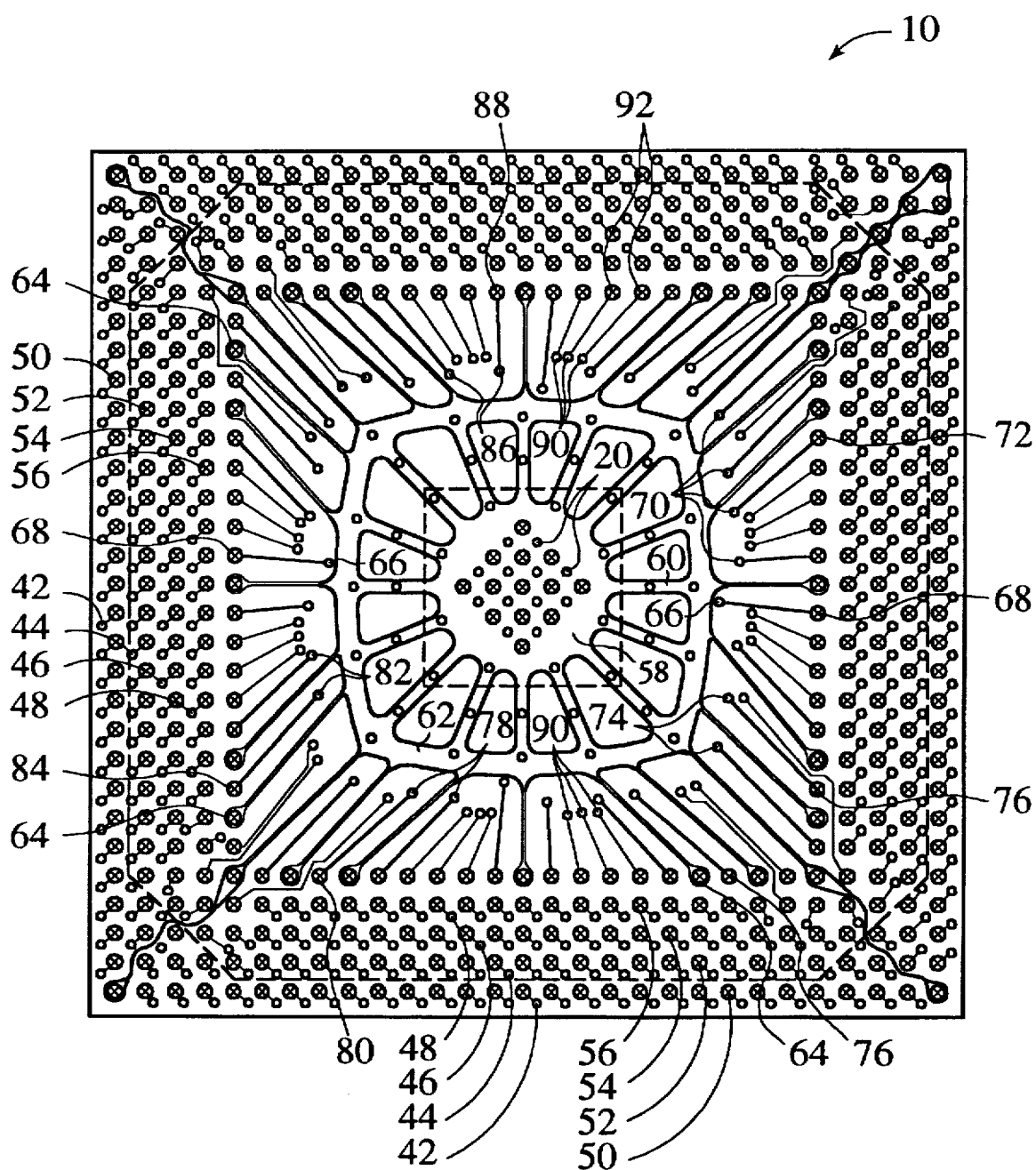
FIG. 4 is a bottom view of the circuit board of FIG. 1.

The signal vias 90 connect to solder balls in the fifth row of the ball grid array, as shown in FIG. 4. As a result of locating signal conduction inwardly of the conventional traces, the number of available signals to the integrated circuit die is not limited to the spacing requirements for forming the array of vias 42–48. The dimensional requirements for forming the array of inner trace ends is less than the dimensional requirements of forming an array of vias.

Referring to the solder balls on the lower surface of the circuit board 10, the first four rows of solder balls 50–56 are connected to signal vias 42–48, as is conventional in the art. However, there is a fifth row of solder balls that is not typically included in prior art ball grid array packages. The fifth row includes ground members 64, $V_{DD}$ members 68, $V_{CC1}$ members 72 and 88, $V_{CC2}$ members 76, $V_{CC3}$ members 80, $V_{CC4}$ members 84, and signal-carrying solder balls 92. The traces to the ground members and the fixed voltage members may be wider than is conventionally possible for traces on a board of a ball grid array package. This provides an advantage over prior art devices.

Figure 5:
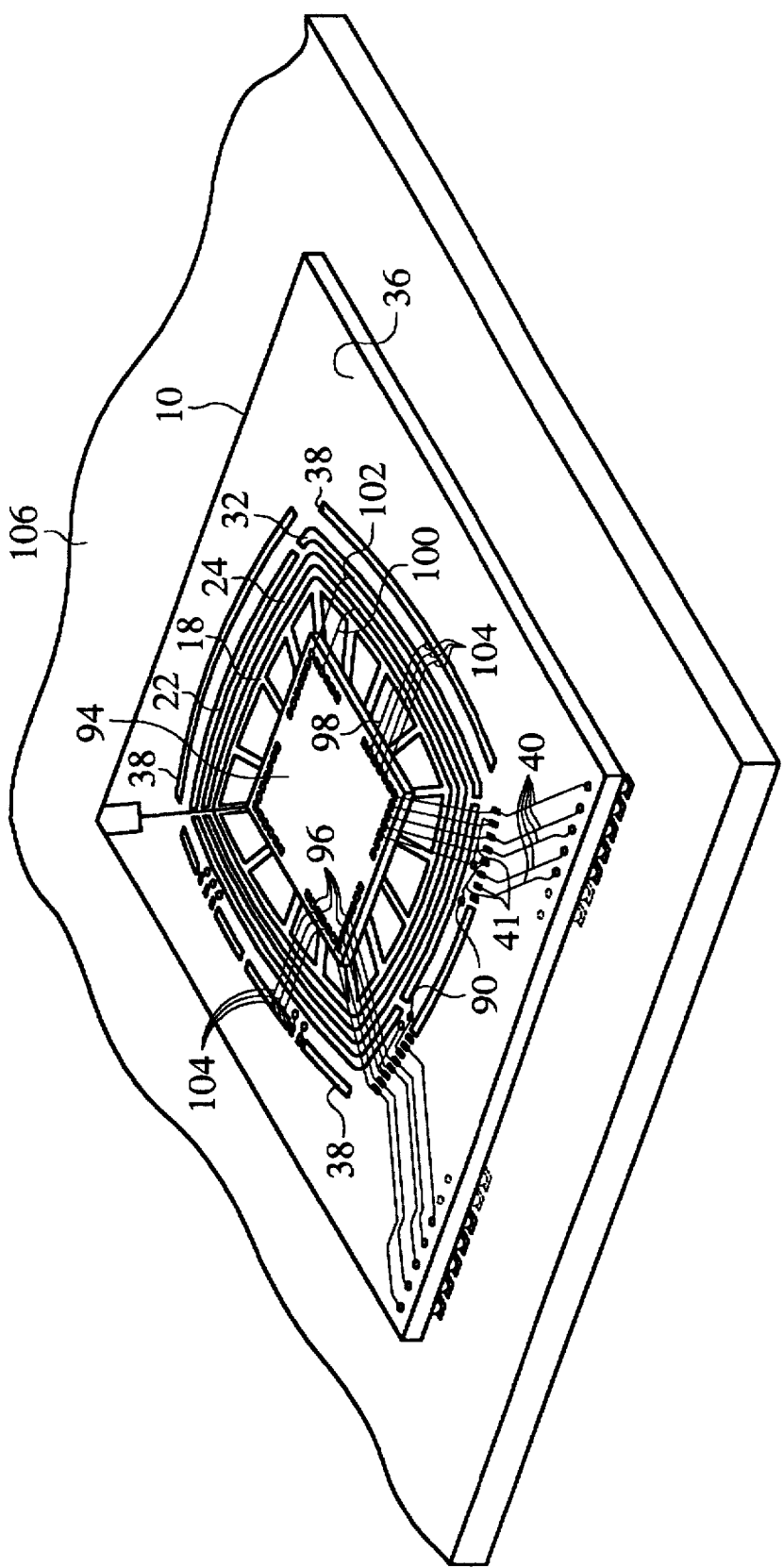
FIG. 5 is a perspective view of an integrated circuit die in electrical and mechanical connection to the circuit board of FIG. 1.

Referring now to FIG. 5, an integrated circuit die 94 is shown as being attached to the circuit board 10. Rather than all of the wire bonds from the die 94 being attached to inner trace ends 38 of FIG. 2, some of the leads are attached to the inner ground trace 18, the $V_{DD}$ trace 24, and the trace segments 26–34 of FIG. 1. FIG. 5 shows wire bonds having inner lead ends connected to input/output pads 96 of the die 94. A first wire bond 98 has an outer lead end connected to the ground trace 18 in the utility region 22 of the circuit board 10. A second wire bond 100 has an outer lead end connected to the $V_{DD}$ trace 24 within the utility region. A third wire bond 102 has an outer lead end connected to trace segment 32 to provide the fixed $V_{CC4}$ voltage to the integrated circuit die 94. Most of the wire bonds will be bonded to inner trace ends 38 of FIG. 3, as represented by the fourth wire bond 104 from the die. While the die-to-board connections have been described as being by means of wire bonds, other conductors may be used, such as leads of a tape automated bonding frame.

The signals and the required fixed electrical potentials are acquired from the motherboard 106 by matching the ball grid array on the bottom surface of the circuit board 10 with a corresponding array on the motherboard. Surface mounting by means of a ball grid array is known in the art. However, the embodiment of FIGS. 1–5 includes a fifth row of solder balls and includes a central array of solder balls for conducting thermal energy from the integrated circuit die 94 to the motherboard 106. Preferably, the thermal energy is conducted to a ground plane of the motherboard, so that the energy is dispersed.

We claim:

1. A substrate for an integrated circuit package comprising:
   an insulative member having opposed first and second sides and having a semiconductor die-attach region on said first side;
   a pattern of signal members arranged on said first side in spaced relationship to said die-attach region for electrical connection to a semiconductor die within said die-attach region by an array of conductive members;
   a ground trace extending longitudinally on said first side in a utility region between said signal members and said die-attach region;
   a power trace extending longitudinally on said first side in said utility region, said power trace being adjacent to said ground trace;
   at least one around connection means for connecting to electrical ground, said around connection means disposed on said second side;
   at least one power connection means for connecting to a power source, said power connection means disposed on said second side;
   at least one ground via extending through said insulative member electrically coupling said around trace to said ground connection means; and
   at least one power via extending through said insulative member electrically coupling said power trace to said power connection means.

2. The substrate of claim 1 wherein said utility region surrounds said die-attach region.

3. The substrate of claim 1 wherein each of said ground trace and said power trace has ring-like configurations.

4. The substrate of claim 1 wherein said signal members are radially extending signal traces having outer trace ends and inner trace ends, said utility region being adjacent to said inner trace ends.

5. The substrate of claim 1 wherein said signal members are signal traces extending from inner trace ends to an array of vias that penetrate said insulative member, said second side of said insulative member having a ball grid array of contacts corresponding to said array of vias.

6. The substrate of claim 1 further comprising conductive vias through said insulative member from said signal members to said second side of said insulative members.

7. The substrate of claim 3 further comprising a segmented ring-like power trace within said utility region on said first side.

8. The substrate of claim 7 wherein said ground trace, said power trace and said segmented ring-like power traces are concentrically arranged about said die-connection region.

9. A chip package comprising:
   a circuit board having opposed first and second surfaces, said first surface having an inner die-attach region and an outer signal trace region, said first surface further having a utility region surrounding said die-attach region to space said signal trace region from said die-attach region, said circuit board having an array of vias extending from said signal trace region to said second surface of said circuit board;
   an integrated circuit die attached within said die-attach region of said first surface, said die having four edges and having a plurality of input/output pads;
   a ground trace within said utility region at each of said four edges of said die, said ground trace being connected to means for connecting to electrical ground;
   a first power trace within said utility region at each of said four edges of said die, said first power trace being connected to means for connecting to a fixed voltage source;
   a plurality of second power traces connected to provide at least two different fixed voltages, said second power traces being within said utility region; and
   an array of conductors having inner wire/lead ends bonded to said input/output pads of said die and having outer wire/lead ends, said outer wire/lead ends including a first plurality connected to said ground trace and a second plurality connected to said power trace, said outer wire/lead ends further including a third plurality connected to sites within said signal trace region.

10. The chip package of claim 9 wherein said plurality of second power traces is arranged to form a segmented ring-shaped trace around said die-attach region.

11. The chip package of claim 9 further comprising said means for connecting said power trace to said fixed voltage source, said means for connecting including power vias extending through said circuit board to traces on said second surface of said circuit board.

12. The chip package of claim 9 wherein said ground trace and said power trace each have a ring-like configuration.

13. The chip package of claim 9 wherein said vias extending from said signal trace region to said second surface have solder balls at said second surface to form a ball grid array.

14. The chip package of claim 13 further comprising an array of conductive signal traces within said signal trace region, said signal traces fanning outwardly with departure from said die-attach region, said signal traces having outer trace ends at said vias and having inner trace ends bonded to said outer wire/lead ends of said leadframe.

15. A substrate for an integrated circuit package comprising:
   an insulative member having opposed first and second sides and having a semiconductor die-attach region on said first side;
   a pattern of signal members arranged on said first side in spaced relationship to said die-attach region for electrical connection to a semiconductor die within said die-attach region by an array of conductive members;

a ground trace extending longitudinally on said first side in a utility region between said signal members and said die-attach region;

a first power trace extending longitudinally on said first side in said utility region, said first power trace being adjacent to said ground trace; and a plurality of second power traces connected to provide at least two different fixed voltages, said second power traces being within said utility region.

16. The substrate of claim 15 wherein said utility region surrounds said die-attach region.

17. The substrate of claim 15 wherein each of said ground trace and said first power trace has ring-like configurations.

18. The substrate of claim 15 wherein said signal members are radially extending signal traces having outer trace ends and inner trace ends, said utility region being adjacent to said inner trace ends.

19. The substrate of claim 15 wherein said signal members are signal traces extending from inner trace ends to an array of vias that penetrate said insulative member, said second side of said insulative member having a ball grid array of contacts corresponding to said array of vias.

20. The substrate of claim 15 further comprising conductive vias through said insulative member from said signal members to said second side of said insulative members.

21. The substrate of claim 17 wherein said plurality of second power traces is arranged to form a segmented ring-like power trace within said utility region on said first side.

22. The substrate of claim 21 wherein said ground trace, said first power trace and said segmented ring-like power trace are concentrically arranged about said die-connection region.

* * * * *